United States Patent
Delano et al.

(10) Patent No.: US 9,639,125 B2
(45) Date of Patent: May 2, 2017

(54) CENTRIFUGAL FAN WITH INTEGRATED THERMAL TRANSFER UNIT

(71) Applicant: Microsoft Technology Licensing, LLC, Redmond, WA (US)

(72) Inventors: Andrew D. Delano, Woodinville, WA (US); Taylor Stellman, Seattle, WA (US); Andrew W. Hill, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 114 days.

(21) Appl. No.: 14/068,715

(22) Filed: Oct. 31, 2013

(65) Prior Publication Data
US 2015/0116928 A1    Apr. 30, 2015

(51) Int. Cl.
*G06F 1/20* (2006.01)
*H01L 23/467* (2006.01)
*H01L 23/433* (2006.01)
*F04D 17/16* (2006.01)
*F04D 29/58* (2006.01)

(52) U.S. Cl.
CPC .............. *G06F 1/20* (2013.01); *F04D 17/16* (2013.01); *F04D 29/582* (2013.01); *G06F 1/203* (2013.01); *H01L 23/433* (2013.01); *H01L 23/467* (2013.01); *H01L 2924/0002* (2013.01)

(58) Field of Classification Search
CPC ......... G06F 1/203; F28F 13/06–13/125; F28F 2250/00–2250/108
USPC .............. 361/679.47, 679.48, 679.49, 679.5, 361/688–703
See application file for complete search history.

(56) References Cited

U.S. PATENT DOCUMENTS

| 5,975,194 | A | 11/1999 | Wagner |
| 6,406,274 | B1 | 6/2002 | Lin et al. |
| 6,571,862 | B1 * | 6/2003 | Wang ............. F28F 3/025 165/80.3 |
| 7,317,614 | B2 * | 1/2008 | Ruch et al. ............. 361/679.48 |

(Continued)

FOREIGN PATENT DOCUMENTS

WO    0143519 A1    6/2001
WO    WO2012012124    1/2012

OTHER PUBLICATIONS

Walsh, et al., "The Performance of Active Cooling in a Mobile Phone", 11th Intersociety Conference on Thermal and Thermomechanical Phenomena in Electonic Systems, May 2008, pp. 44-48.

(Continued)

*Primary Examiner* — Tuan T Dinh
*Assistant Examiner* — Mukund G Patel
(74) *Attorney, Agent, or Firm* — Lee & Hayes, pllc (57) ABSTRACT

Disclosed herein are computing devices, and methods of manufacturing computing devices, that have a cooling fan and integrated thermal transfer unit. A centrifugal fan unit includes a rotatable hub, a plurality of blades disposed on the rotatable hub, and a motor coupled to the rotatable hub. The motor causes the rotatable hub to rotate about an axis such that airflow proceeds outward from the centrifugal fan unit along trajectories that are perpendicular to the axis. One or more thermal transfer units have first portions that are coupled to the one or more heat sources and second portions that collectively at least partially surround the centrifugal fan unit.

17 Claims, 6 Drawing Sheets

(56) References Cited

U.S. PATENT DOCUMENTS

| | | | |
|---|---|---|---|
| 7,508,662 | B2 | 3/2009 | Chang |
| 7,969,730 | B1 | 6/2011 | Doherty et al. |
| 8,432,696 | B2 | 4/2013 | Ribas et al. |
| 8,477,490 | B2 | 7/2013 | Rothkopf et al. |
| 2002/0172008 | A1 | 11/2002 | Michael |
| 2003/0131970 | A1* | 7/2003 | Carter .................... B21C 23/10 165/80.3 |
| 2003/0161102 | A1 | 8/2003 | Lee et al. |
| 2007/0086157 | A1 | 4/2007 | Ruch et al. |
| 2008/0011454 | A1* | 1/2008 | Hwang et al. ............... 165/80.3 |
| 2008/0043431 | A1* | 2/2008 | Marotta ................ H01L 23/467 361/689 |
| 2008/0106171 | A1 | 5/2008 | Mongia |
| 2010/0123372 | A1 | 5/2010 | Huang et al. |
| 2010/0220439 | A1* | 9/2010 | Qin ......................... 361/679.47 |
| 2011/0194252 | A1 | 8/2011 | Wang |
| 2012/0055653 | A1* | 3/2012 | Chen ................... F04D 29/441 165/121 |
| 2013/0055727 | A1 | 3/2013 | Choi |
| 2013/0199759 | A1 | 8/2013 | Chou |

OTHER PUBLICATIONS

"International Search Report & Written Opinion Issued in PCT Patent Application No. PCT/US2014/062486", Mailed Date: Feb. 25, 2015, 12 Pages.

PCT Second Written Opinion mailed on Sep. 28, 2015 for PCT Application No. PCT/US14/62486, 9 pages.

"International Preliminary Report on Patentability Issued in PCT Application No. PCT/US2014/062486", Mailed Date: Feb. 1, 2016, 7 Pages.

* cited by examiner

CENTRIFUGAL FAN WITH INTEGRATED THERMAL TRANSFER UNIT

BACKGROUND

A computing device includes various electronic components that produce heat during operation, such as central processing units, graphical processing units, and so forth. Since such devices can be damaged by overheating, the computing device may include a cooling mechanism. One such mechanism includes a centrifugal fan, which produces airflow in 360 degrees along trajectories that are perpendicular to its axis of rotation. In a conventional arrangement, the centrifugal fan is placed into a housing that directs ("turns") the airflow towards an outlet. A thermal transfer device includes fins that are situated near the outlet of the centrifugal fan housing. Heat is communicated from the electronic components to the fins by conduction and/or phase change convection (heatpipe), and air blowing from the outlet cools the fins.

Such conventional systems incur losses, such as from resistance due to turning the air towards the outlet. Also, air naturally exits off the impeller of a centrifugal fan in 360 degrees, and thus initially has a relatively large cross-sectional flow area compared to the relatively small cross-sectional flow area of the scroll housing where the air finally exits a conventional blower. Directing air towards a smaller cross-sectional flow area, as with an outlet in a conventional fan, results in increased velocity since a given volume of air travels faster through a smaller area than through a larger one. Because airflow resistance increases exponentially with velocity, the outlet causes additional airflow resistance. Some of the power used to operate such conventional fans is therefore lost overcoming these resistances.

BRIEF SUMMARY

This Summary is provided in order to introduce simplified concepts of the present disclosure, which are further described below in the Detailed Description. This summary is not intended to identify essential features of the claimed subject matter, nor is it intended for use in determining the scope of the claimed subject matter.

Embodiments include a centrifugal fan unit having an integrated thermal transfer unit. Embodiments include one or more thermal transfer units that at least partially surround the fan. Airflow from the fan is at least partially unimpeded between the fan and the thermal transfer unit, thereby reducing or eliminating the resistance due to turning of the air as in conventional fans. Also, allowing air to blow directly outwards from the fan to the thermal transfer unit results in a larger cross-sectional flow area and lower airflow resistance.

BRIEF DESCRIPTION OF THE DRAWINGS

The Detailed Description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Embodiments include a centrifugal fan unit having an integrated thermal transfer unit. As noted above, conventional centrifugal fan cooling systems used in computing systems incur losses due to resistance. Embodiments of the present disclosure reduce or eliminate resistance common in conventional fan-based cooling systems. Embodiments include thermal transfer units that at least partially surround the fan. Airflow from the fan is at least partially unimpeded between the fan and the thermal transfer unit, thereby reducing or eliminating the resistance due to turning of the air as in conventional fans. Also, allowing air to blow directly outwards from the fan to the thermal transfer unit, without first directing the air to a relatively narrow outlet, results in a larger cross-sectional flow area and therefore lower airflow resistance. Fans according to embodiments of the present disclosure are system-level fans designed specifically for the computing system into which they are placed, rather than conventional, off-the-shelf fans, produced as modular components that include a housing and an outlet. Compared with conventional designs, embodiments of the present disclosure provide more efficient cooling, such as measured by the amount of power required to produce a given amount of heat transfer in the form of cooling a surface or object.

Although the present description describes airflow from centrifugal fans as proceeding, blowing, flowing, moving, etc. in a plane that is perpendicular to an axis of rotation of a centrifugal fan, such airflow is not limited to a single plane; rather airflow proceeds outward from a centrifugal fan as a volume of air that travels through three-dimensional space. Thus, the bulk of the air moved by the centrifugal fans flows in multiple trajectories, each substantially perpendicular to an axis of rotation of the centrifugal fan. Some airflow will inevitably proceed in other directions of travel that are not perpendicular to the axis of rotation, but the bulk of the airflow will proceed in trajectories that are perpendicular to the axis of rotation.

The devices, processes, and systems described herein may be implemented in a number of ways. Example implementations are provided below with reference to the following figures.

Example Cooling Systems

Figure 1:
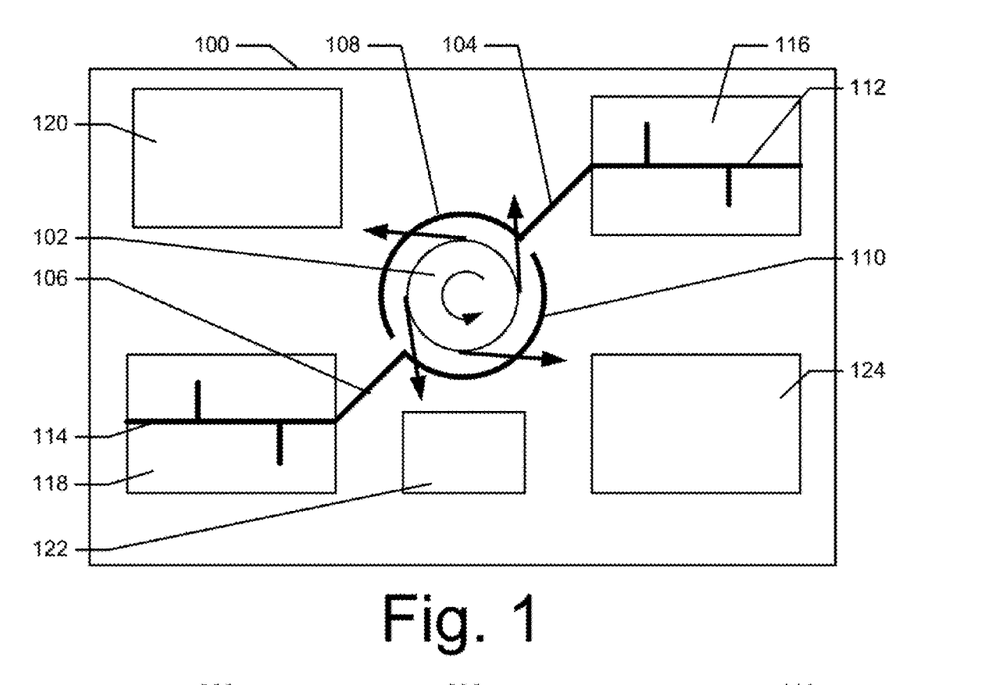
FIG. 1 is a block diagram of an example computing device having a centrifugal fan unit with integrated thermal transfer units.

FIG. 1 is a block diagram of an example computing device 100 having a centrifugal fan unit 102 with integrated thermal transfer units. In the example illustrated in FIG. 1, the centrifugal fan unit 102 includes a first integrated thermal transfer unit 104 and a second integrated thermal transfer unit 106. As will be discussed in more detail elsewhere within this Detailed Description, the centrifugal fan unit 102 includes a rotatable hub, a plurality of blades disposed on the rotatable hub, and a motor coupled to the rotatable hub. The motor is controllable to cause the rotatable hub to rotate about an axis in either a clockwise or counterclockwise direction (illustrated by the circular arrow in FIG. 1) such that airflow proceeds outward from the centrifugal fan unit, in 360 degrees, within trajectories that are perpendicular to the axis of rotation. Air leaves the centrifugal fan unit 102 along trajectories that are tangential to a circle defined by the edges of the blades of the centrifugal fan unit 102 (as illustrated in FIG. 1 by the arrows). Portions 108 and 110 of the thermal transfer units 104 and 106 collectively at least partially surround the centrifugal fan unit in the plane perpendicular to the axis.

Portions 112 and 114 of the thermal transfer units 104 and 106 are thermally coupled to electronic components 116 and 118, which are heat sources within the computing device 100. The thermal transfer units 104 and 106 are configured to communicate thermal energy from the electronic components 116 and 118 to the portions 108 and 110. The thermal transfer units 104 and 106 may communicate the thermal energy via convection of a fluid or gas contained within the thermal transfer units 104 and 106, via phase changes of a substance contained within the thermal transfer units (as in a heat pipe vapor chamber), or via thermal conduction.

The computing device may include other electronic components 120, 122, and 124. The electronic components 116-124 include, in various embodiments, semiconductor devices such as processors (including multi-core processors), graphical processing units, communication hardware (such as modems, transceivers, antennas, etc.), memory devices, display hardware, input/output devices, and other electronic components such as batteries (which may include semiconductor components), and so forth. Embodiments are not limited to any type or types of electronic components. In a particular example, the electronic component 116 is a central processing unit (CPU) and the electronic component 118 is a graphical processing unit (GPU), but other examples are possible without departing from the scope of the present disclosure. The various electronic components are disposed, in various embodiments, on one or more circuit boards, which may be fixed to the inner portion of the housing of the computing device 100.

In the example illustrated in FIG. 1, the centrifugal fan unit 102 has two integrated thermal transfer units 104 and 106, which may contain thermal transfer surfaces, such as fins, over which output airflow from the centrifugal fan unit 102 flows. Collectively, the thermal transfer units 104 and 106 substantially surround the centrifugal fan unit 102. In other embodiments, a single thermal transfer unit may be used, and the single thermal transfer unit may by itself partially, substantially, or completely surround the centrifugal fan unit 102. In still other embodiments, more than two thermal transfer units are included, each thermally coupled to electronic components or other heat sources of the computing device 100. In some embodiments, a thermal transfer unit is coupled to more than one electronic component; in the same or other embodiments, two or more thermal transfer units are coupled to the same electronic component.

In some embodiments, a first thermal transfer unit may be disposed underneath another thermal transfer unit, such that both are positioned in the path of airflow from the centrifugal fan unit 102. Other examples are possible without departing from the scope of embodiments.

The thermal transfer units 104 and 106 are constructed, in various embodiments, from materials that have relatively high thermal conductivities, such as copper or copper alloys, aluminum, silver, gold, platinum, carbon-based (such as graphite) or other materials.

The airflow from the centrifugal fan unit 102 proceeds unimpeded from the centrifugal fan unit 102 and the portions 108 and 110 of the one or more thermal transfer units 104 and 106, in trajectories that are substantially distributed in 360 degrees around the centrifugal fan unit 102 and that are perpendicular to the axis of rotation of the centrifugal fan unit 102. Such unimpeded airflow encounters less resistance than airflow in conventional centrifugal fans where the airflow is turned by a housing and directed towards an outlet. Also, as is illustrated in more detail elsewhere within this Detailed Description, fins of the thermal transfer units 104 and 106 form divergent fin channels that result in a relatively lower airflow velocity (compared to conventional designs), thereby producing less air resistance.

Although the portions 108 and 110 of the thermal transfer units 104 and 106 are illustrated as being substantially rounded or circular in shape, embodiments are not limited to rounded or circular-shaped thermal transfer unit portions. In some embodiments, the portions may be triangular, rectangular, square, star-shaped, irregularly shaped, or have some other non-linear shape.

Figure 2:
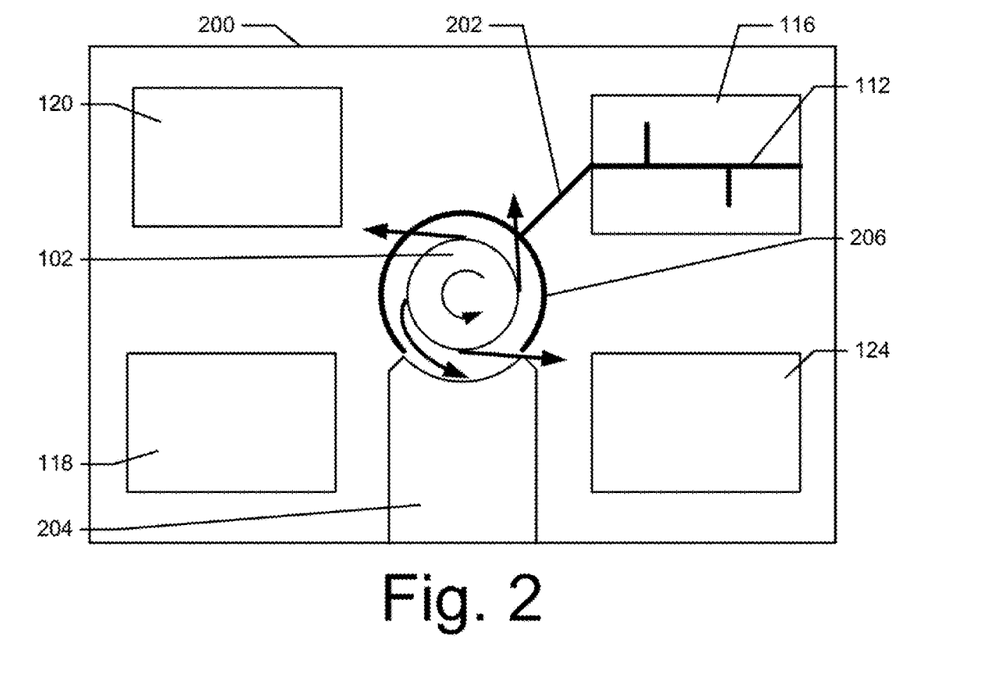
FIG. 2 is a block diagram of an example computing device having a centrifugal fan unit with an integrated thermal transfer unit, and an air intake channel that partially occupies a plane of the fan's outlet airflow.

FIG. 2 is a block diagram of an example computing device 200 having a centrifugal fan unit 102 with an integrated thermal transfer unit 202, and an air intake channel 204 that partially occupies a plane of the fan's outlet airflow. Except as stated otherwise, the features of computing device 200 are substantially the same as the features described above with respect to computing device 100. The computing device 200 of FIG. 2 includes a single thermal transfer unit 202.

Because the air intake channel 204 partially occupies a plane of the outlet airflow, the centrifugal fan unit 102 is substantially completely surrounded by a combination of the thermal transfer unit 202 and the air intake channel. As a result, not all of the airflow from the centrifugal fan unit 102 proceeds unimpeded towards the portion 206 of the thermal transfer unit 202 that is disposed partially around the centrifugal fan unit 102. Therefore, some of the airflow is unimpeded, while some of the airflow is deflected before passing over or through the thermal transfer unit 202 (as indicated by the arrows in FIG. 2). As noted above, turning or directing the airflow results in losses. Even where the one or more thermal units do not substantially or completely surround the centrifugal fan unit 102 in the plane of its airflow (as in FIG. 2), embodiments are more efficient than conventional centrifugal fan units as long as the thermal units are disposed around the centrifugal fan unit 102 to some threshold degree, such as at least 50%. Thus, the thermal transfer units partially surround the centrifugal fan unit, and airflow flows unimpeded (e.g., without being directed or turned by a structure that is situated between the centrifugal fan unit 102 and the portion 206 of the thermal transfer unit 202) in at least 180 degrees within the plane that is perpendicular to the axis of rotation of the centrifugal fan unit 102.

As with FIG. 1, in alternative embodiments, more than one thermal transfer unit may be included, with each thermal transfer unit thermally coupled to electronic components or other heat sources of the computing device. In some embodiments, a thermal transfer unit is coupled to more than one electronic component; in the same or other embodiments, two or more thermal transfer units are coupled to the same electronic component. In the same or different embodiments, one thermal transfer unit may be placed on top of another thermal transfer unit such that they are both in the path of the fan's outward airflow. Other examples are possible without departing from the scope of embodiments.

Figure 3:
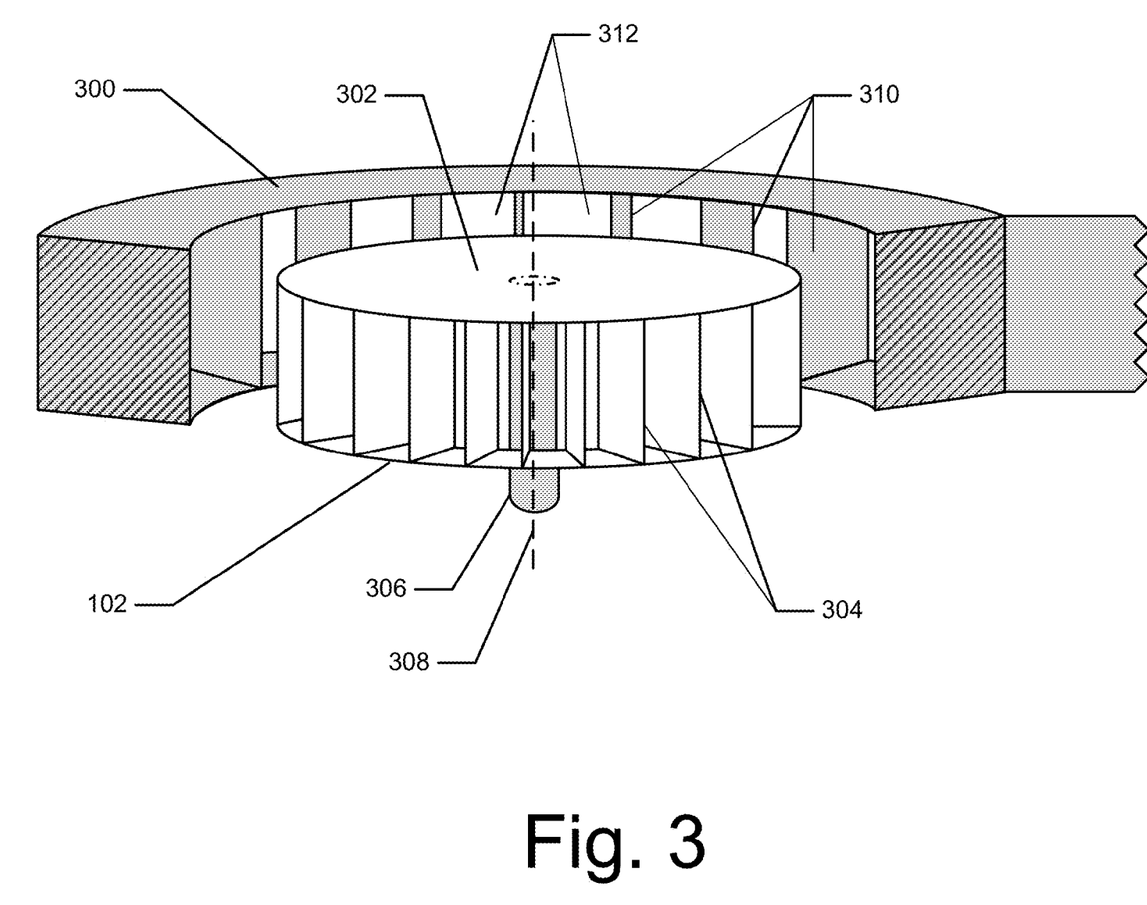
FIG. 3 is a cross-sectional isometric view of a centrifugal fan unit and an integrated thermal transfer unit.

FIG. 3 is a perspective view of a centrifugal fan unit 102 and an integrated thermal transfer unit 300. The thermal transfer unit 300 may be similar to or the same as the thermal transfer units 104, 106, or 202. The centrifugal fan unit 102 includes a hub 302, a plurality of blades 304, and a motor 306. The hub 302 is a rotatable hub, and the motor 306 is configured to rotate the hub 302 about an axis 308, illustrated as dashed line in FIG. 3. The motor 306 is a direct current or alternating current electric motor, although non-electric motors may be used without departing from embodiments. In alternative embodiments, the motor 306 is not located directly inside the hub 302; cables or belts may couple the motor 306 to the hub 302 to rotate the hub 302. The plurality of blades 304 may be formed as part of the hub 302 during manufacturing, or may be separately manufactured components.

Airflow from the centrifugal fan unit 102 proceeds outwards in trajectories that are perpendicular to the axis 308. The airflow proceeds unimpeded towards the thermal transfer unit 300, which includes a plurality of heat transfer surfaces 310. The heat transfer surfaces 310 are illustrated in FIG. 3 as thin fin structures. But in alternative embodiments, other, more, and/or fewer, heat transfer surfaces may be used, such as fins with various features to increase heat transfer surface area, such as fins-on-fins, dimples, bumps, ridges, irregular-shaped fins, and so forth. The plurality of blades 304 are illustrated in FIG. 3 as having an orientation such that they are perpendicular to the axis of rotation; however, the blades 304 may be oriented in some other fashion. The plurality of heat transfer surfaces 310 form channels 312 through which airflow proceeds. In some embodiments, the blades 304 are angled differently than the heat transfer surfaces 310. Such configuration may reduce or smooth noises caused by outside edges of the blades 304 passing by the heat transfer surfaces 310, such as noises associated with a blade-passing frequency.

Other centrifugal fan designs besides the one illustrated in FIG. 3 may be utilized without departing from the scope of this disclosure. In some embodiments, the plurality of blades 304 are tilted forward with respect to the direction of rotation (such that outside edges of the blades (those further from the center of the hub 302) proceed ahead of the inside edges of the blades) or tilted backwards with respect to the direction of rotation (such that the inside edges of the blades proceed ahead of the outside edges of the blades). As noted above, the blades may be angled with respect to the heat transfer surfaces 310, such that top edges of the blades 304 proceed ahead of bottom edges of the blades 304, or vice versa. The blades may be curved (either forward or backward, or from top to bottom), and so forth. Various combinations of blades may be used, such that some angled, some tilted, and some curved or irregular-shaped blades may be used on the same fan. The hub 302 may only partially enclose the plurality of blades 304, or may not enclose the plurality of blades 304 at all. Embodiments are not limited to any one type or types of centrifugal fan designs.

Figure 4:
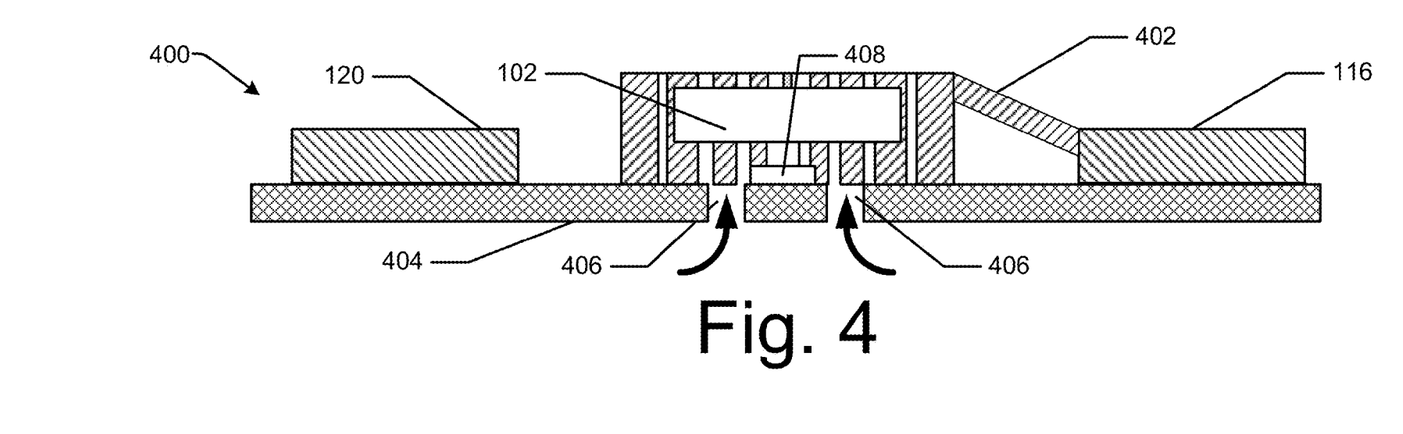
FIG. 4 is a side elevation view of a computing device having bottom (or back) surface intake airflow for a centrifugal fan unit and an integrated thermal transfer unit.

FIG. 4 is a side view of a computing device 400 having bottom (or back) surface intake airflow for a centrifugal fan unit 102 and an integrated thermal transfer unit 402. The configuration shown in FIG. 4 may be the same as or similar to the configuration of the example computing device 100 illustrated in FIG. 1, although it may also correspond to other configurations not illustrated in FIG. 1. A first surface of the housing 404 of the computing device 400 includes air holes 406 through which intake air is able to enter the housing 404 at a point near to the centrifugal fan unit 102 (as illustrated by the arrows in FIG. 4). The centrifugal fan unit 102 may be mounted on a plate 408, which is disposed on an inner portion of the first surface of the housing 404. The embodiments illustrated in FIG. 4 allow for direct intake airflow for the centrifugal fan unit 102.

Figure 5:
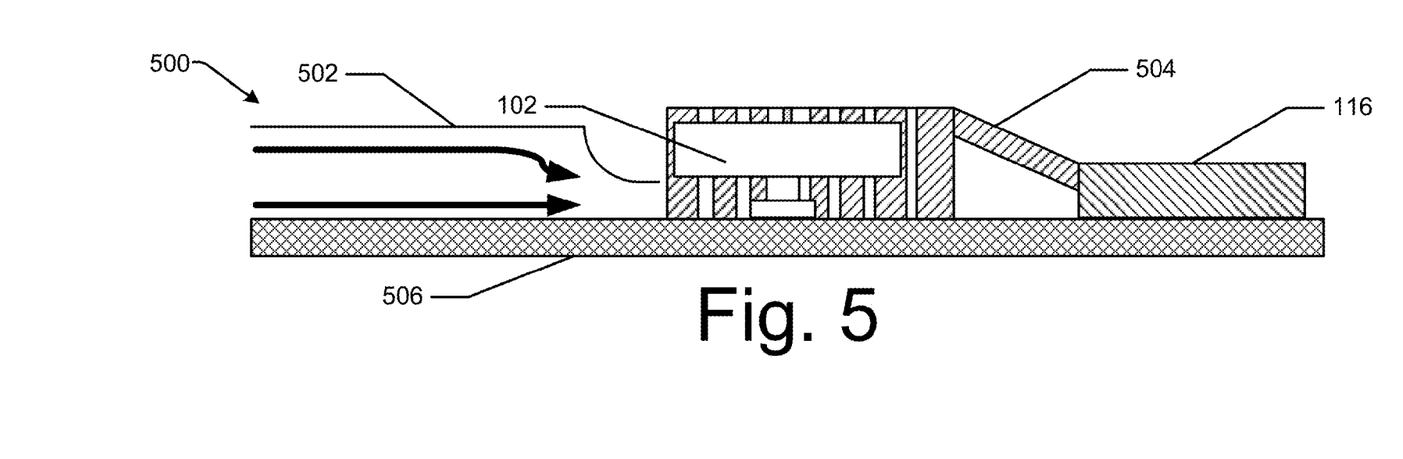
FIG. 5 is a side elevation view of a computing device having intake airflow through an intake air channel that partially occupies the plane of the fan's outlet airflow.

FIG. 5 is a side view of a computing device 500 having intake airflow through an intake air channel 502 that partially occupies the plane of the fan's outlet airflow. The centrifugal fan unit 102 includes an integrated thermal transfer unit 504. The configuration shown in FIG. 5 may be the same as or similar to the configuration of the example computing device 200 illustrated in FIG. 2, although it may also correspond to other configurations not illustrated in FIG. 2. An air hole is present in the housing 506 of the computing device 500 (such as a bottom surface or a side surface). Air travels towards the centrifugal fan unit 102 from the side (as illustrated by the arrows in FIG. 5) from where it is drawn in from the bottom of the centrifugal fan unit 102 and blown outward towards the heat transfer surfaces of the thermal transfer unit 504. As discussed with respect to FIG. 2, the presence of the intake air channel 502 in the plane of the direction of outlet airflow reduces the degree to which the thermal transfer unit 504 is positioned around the centrifugal fan unit 102, and is thus only partially positioned around the centrifugal fan unit 102.

Figure 6:
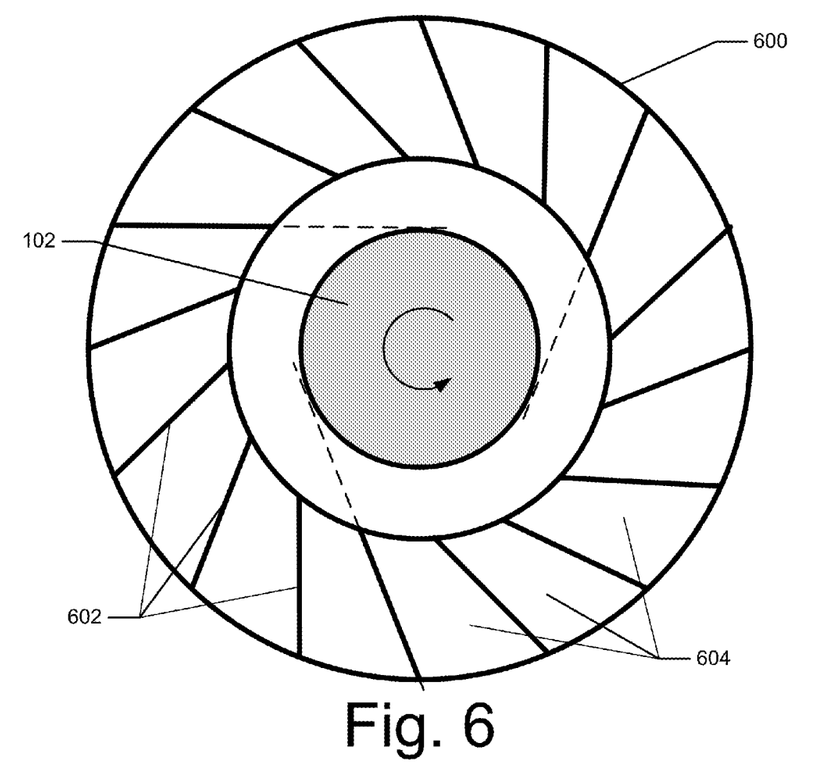
FIG. 6 is a schematic view of a centrifugal fan unit and an integrated thermal transfer unit showing the collinear alignment of heat transfer surfaces with tangent lines of the centrifugal fan unit.

FIG. 6 is a top-down view of a centrifugal fan unit 102 and an integrated thermal transfer unit 600 showing the collinear alignment of heat transfer surfaces with tangent lines of the centrifugal fan unit 102. Air flows outward from the centrifugal fan unit 102 along trajectories that are collinear with tangent lines of a circle that is formed by the outside edges of the blades of the centrifugal fan unit 102. Some of the tangent lines are shown for the sake of illustration by dashed lines in FIG. 6. The heat transfer surfaces 602 of the thermal transfer unit 600 are positioned to be collinear with the tangent lines of the centrifugal fan unit 102. The heat transfer surfaces 602 form channels 604; the arrangement of the heat transfer surfaces 602 reduces the resistance to airflow through the channels 604, thereby resulting in more efficient operation and cooling.

Embodiments may include more or fewer heat transfer surfaces 602 than are shown in FIG. 6.

Figure 7:
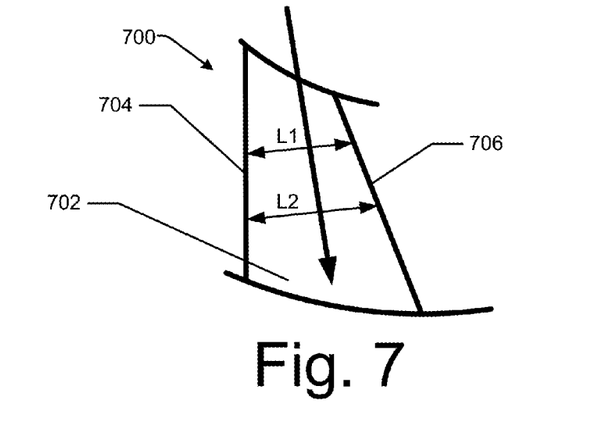
FIG. 7 illustrates a portion of a thermal transfer unit having a channel with a divergent cross-sectional flow area.

FIG. 7 illustrates a portion of a thermal transfer unit 700 having a channel 702 with a divergent cross-sectional flow area. The channel 702 is formed by two thermal transfer surfaces 704 and 706. As with the arrangement of heat transfer surfaces 602 in FIG. 6, the thermal transfer surfaces 704 and 706 are oriented to be collinear with the tangents of a circle formed by the outside edges of the blades of a centrifugal fan unit. The direction of the airflow from the centrifugal fan unit is illustrated for the sake of convenience by an arrow in FIG. 7. Because the thermal transfer unit 700 is disposed at least partly around the centrifugal fan unit, and because the thermal transfer surfaces 704 and 706 are positioned along tangent lines of the centrifugal fan unit, the channel 702 diverges along its length. In other words, the channel 702 has a first cross-sectional length L1 at a first location that is smaller than a second cross-sectional length L2 at a second location. The channel 702 therefore has a first cross-sectional area at the first location that is smaller than a second cross-sectional area at the second location. The divergent nature of the channel 702 results in increasing cross-sectional surface area as the airflow proceeds away from the centrifugal fan unit, therefore resulting in decreased airflow velocity and increased pressure (due to Bernoulli's principle), which improves airflow by reducing frictional losses. Air resistance is proportional to velocity squared; thus, reducing velocity lowers airflow resistance and improves the effectiveness of the cooling system.

Figure 8:
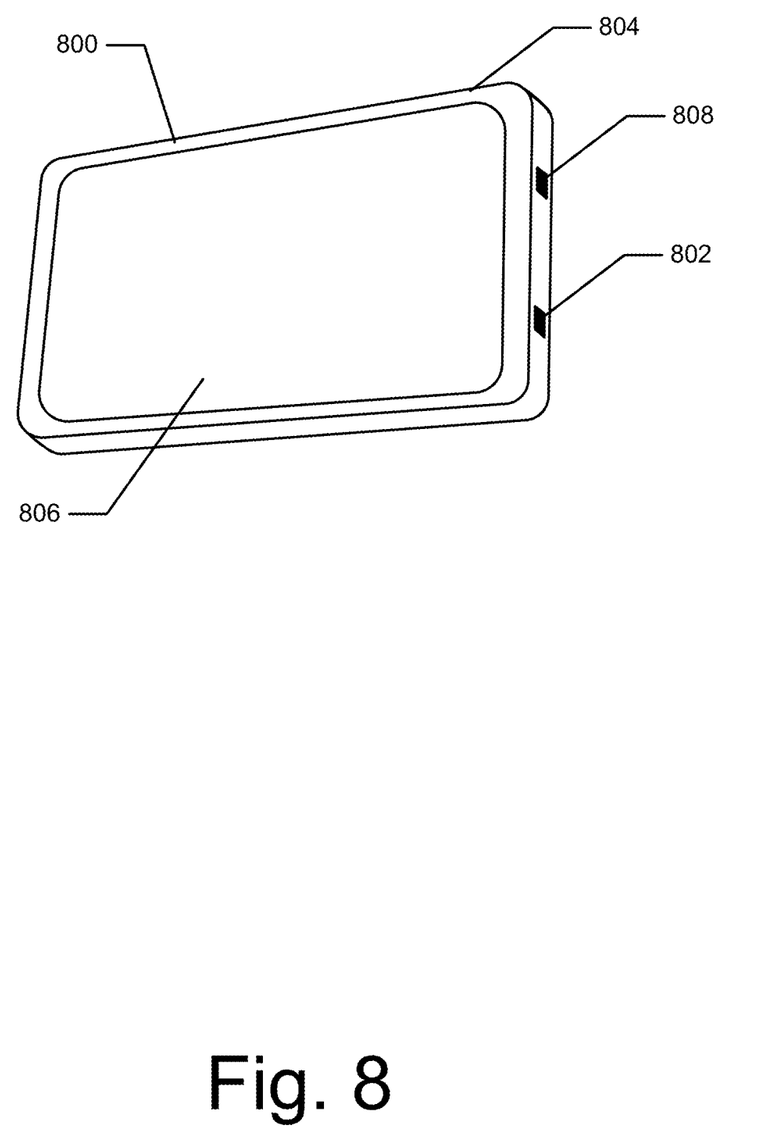
FIG. 8 is an isometric view of an example computing device according to embodiments that includes an intake air hole on a side surface of a housing.

FIG. 8 is a perspective view of an example computing device 800 according to embodiments that includes an intake air hole 802 on a side surface of a housing 804. An air intake channel (such as the air intake channel 204) has the intake air hole 802 as its opening. The computing device 800 includes a display screen 806 either disposed on or substantially comprising a portion of an outer surface of the housing 804. The display screen 806 may be a touch-enabled or touch-integrated display. The housing 804 may include one or more air exhaust holes 808 on various surfaces of the housing 804 that allows heated air to exit the computing device 800. The housing 804 includes various components, such as a centrifugal fan unit (including the plate onto which the centrifugal fan unit is mounted), one or more thermal transfer units, one or more heat sources (such as electronic components including one or more of processors, controllers, batteries, transceivers, and so forth).

A centrifugal fan unit, such as the centrifugal fan unit 102, draws air into the computing device 100 through the intake air hole 802. The air heats up as it passes over thermal transfer units disposed within the housing 804, and then circulates throughout the interior of the computing device before being exhausted through one or more air exhaust holes, such as the one or more air exhaust holes 808. Alternatively, the exhaust air may be channeled towards the one or more air exhaust holes 808 by one or more interior structures, which may prevent or reduce the amount off dust, dirt, or other matter from settling on interior components of the computing device 800. In alternative embodiments, such as those described with respect to FIG. 4, one or more exhaust holes may be disposed on a bottom or backside of the housing 804. In an embodiment, the cross sectional area of the exhaust (808) is greater than the cross sectional area of the inlet (802), which increases the effectiveness of the system.

Although the computing device 800 illustrated in FIG. 8 is a tablet computer, embodiments are usable with other types of computing devices, such as mobile phones (including smart phones), "phablets" (large form-factor smart phones), laptop computers, game consoles, desktop computers, server blades, special-purpose tablets, and so forth, some of which may have different form factors and/or components than those illustrated in FIG. 8.

Example Operations for Manufacturing a Computing Device

Figure 9:
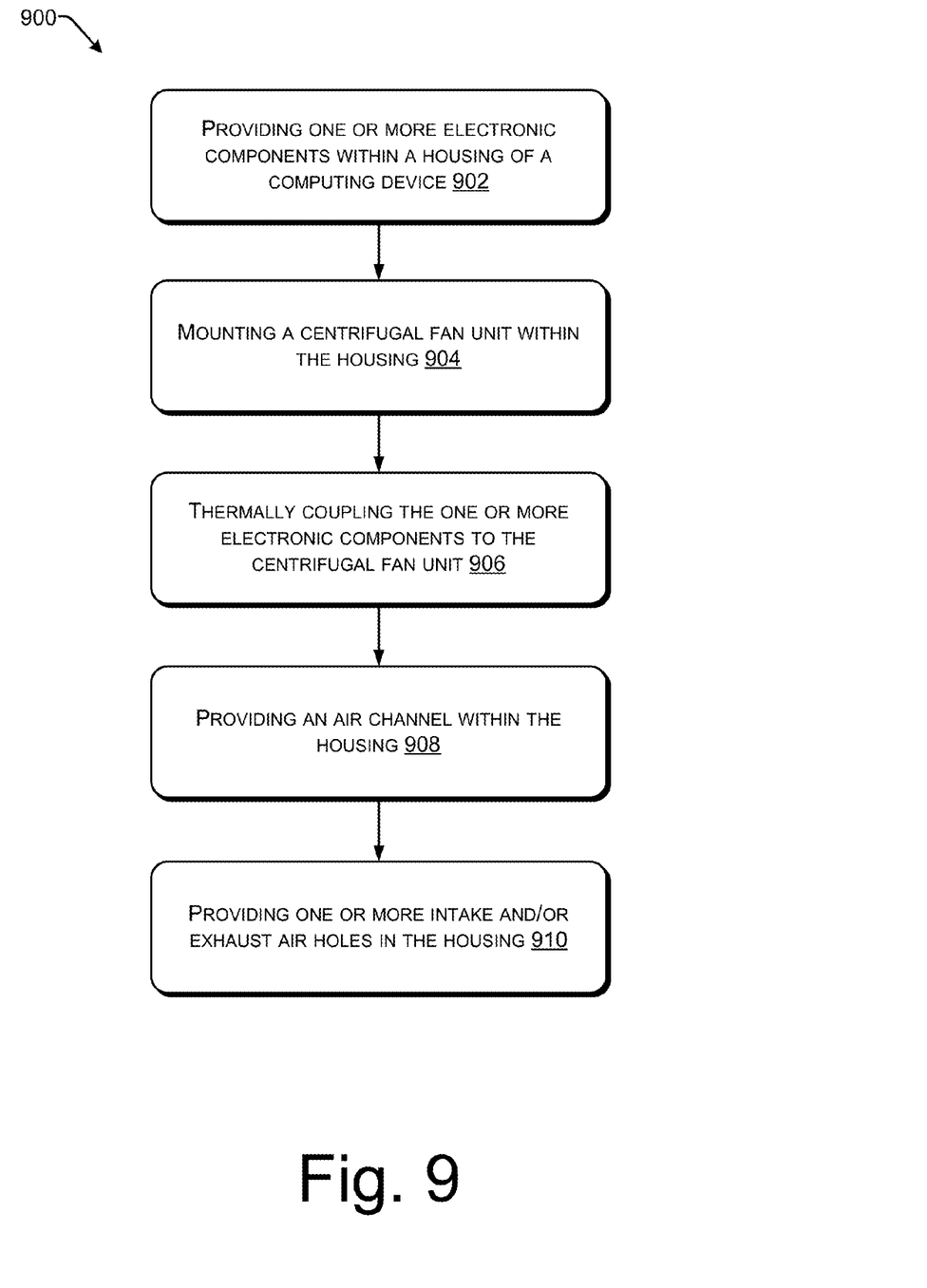
FIG. 9 is a flow diagram showing an example process for manufacturing a computing device having a centrifugal fan and an integrated thermal transfer unit.

FIG. 9 is a flow diagram showing an example process 900 for manufacturing a computing device having a centrifugal fan and an integrated thermal transfer unit. At 902, one or more electronic components are provided within a housing of the computing device. The electronic components include one or more of central processing units, a graphical processing unit, a controller, a memory device, a power source, a wireless or wired transceiver, a battery, and so forth.

At 904, a centrifugal fan unit is mounted within the housing of the computing device. The centrifugal fan unit includes a hub, a plurality of blades disposed on the hub, and a motor, which is configured to rotate the hub about an axis of the hub such that the plurality of blades cause airflow from the centrifugal fan unit to proceed outward from the hub in trajectories that are perpendicular to the axis. In some embodiments, the centrifugal fan unit is mounted on a plate that is disposed on an inner portion of a surface of the computing device.

At 906, the one or more electronic components are thermally coupled to the centrifugal fan unit with one or more thermal transfer units. The one or more thermal transfer units collectively at least partially surround the centrifugal fan unit such that the airflow moves unimpeded from the centrifugal fan unit to the second portions of the one or more thermal transfer units. The one or more thermal transfer units include one or more pluralities of heat transfer surfaces, such as fins or other components. In some embodiments, the one or more pluralities of heat transfer surfaces form divergent channels that are relatively narrower at first positions that are nearer to the centrifugal fan unit than at second positions that are further away from the centrifugal fan unit. In some embodiments, the one or more pluralities of heat transfer surfaces are positioned along tangent lines of the centrifugal fan unit.

At 908, an intake air channel is provided within the housing of the computing device. In some embodiments, the air channel is at least partially positioned within the plane that is perpendicular to the axis of the rotation of the centrifugal fan such that a combination of a portion of the air channel and the one or more thermal transfer units substantially surround the centrifugal fan unit.

At 910, one or more air holes are provided on the surface of the computing device. In some embodiments, intake air holes are provided near to a position within the housing where the centrifugal fan unit is mounted, such as on a bottom surface or other of the computing device, which allows air to flow directly into the fan. In the same and different embodiments, intake air holes are provided near to an opening of an intake air channel, such as on the side of the computing device, although they may be position on the bottom of the housing. In various embodiments, exhaust air holes are provided on various surfaces to allow the heated exhaust air to exit the device.

FIG. 9 depicts a flow graph that shows an example process in accordance with various embodiments. The operations of this example process are illustrated in individual blocks and summarized with reference to those blocks. The order in which the operations are described is not intended to be construed as a limitation, and any number of the described operations can be combined in any order, separated into sub-operations, and/or performed in parallel to implement the process. Processes according to various embodiments of the present disclosure may include only some or all of the operations depicted in the logical flow graph.

CONCLUSION

Although the disclosure uses language that is specific to structural features and/or methodological acts, the invention is not limited to the specific features or acts described. Rather, the specific features and acts are disclosed as illustrative forms of implementing the invention.

What is claimed is:
1. An apparatus comprising:
one or more heat sources;

a centrifugal fan unit having a hub, a plurality of blades disposed on the hub, and a motor coupled to the hub, the motor to cause the hub to rotate about an axis such that airflow proceeds outward from the centrifugal fan unit along trajectories that are perpendicular to the axis;

one or more thermal transfer units having at least first portions that are coupled to the one or more heat sources and second portions that collectively at least partially surround the centrifugal fan unit, the second portions of the thermal transfer units surrounding the centrifugal fan unit comprising a plurality of fins that are collinear with tangents of a circle that is formed by outside edges of the plurality of blades of the centrifugal fan unit;

a housing that encloses the heat source, the centrifugal fan unit, and the thermal transfer units;

a plate that is disposed on an inner portion of a surface of the apparatus, the centrifugal fan unit mounted on the plate; and one or more holes on the surface of the apparatus near to a position of the centrifugal fan unit to enable intake airflow to proceed towards the centrifugal fan unit from the one or more holes.

2. The apparatus of claim 1, wherein the one or more thermal transfer units are situated such that airflow from the centrifugal fan unit is at least partially unimpeded between the centrifugal fan unit and the second portions of the one or more thermal transfer units.

3. The apparatus of claim 1, wherein the second portions of the thermal transfer units collectively surround the centrifugal fan unit in a substantially circular shape.

4. The apparatus of claim 1, wherein the plurality of fins form fin channels, first cross-sectional areas of first locations of the fin channels being smaller than second cross-sectional areas of second locations of the fin channels, the first locations being closer to the centrifugal fan unit than the second locations.

5. The apparatus of claim 1, further comprising:
an air intake channel disposed in the housing, wherein the air intake channel at least partially occupies a plane of the airflow, the air intake channel directing intake airflow to enter the housing from an opening in the housing and directing the intake airflow to flow towards the centrifugal fan unit, a portion of the air intake channel being positioned to impede the trajectories of the airflow that are perpendicular to the axis of the centrifugal fan unit such that a combination of the portion of the air intake channel and the second portions of the thermal transfer units substantially surround the centrifugal fan unit within one or more planes.

6. The apparatus of claim 1, wherein the one or more heat sources include one or more of a central processing unit, a graphical processing unit, a controller, a memory device, a power source, or a battery.

7. The apparatus of claim 1, further comprising at least one hole on the surface of the housing to enable the airflow to exit the housing, wherein a cross sectional area of the at least one hole is greater than a cross sectional area of the air intake opening.

8. The apparatus of claim 1, wherein the one or more thermal transfer units comprise a plurality of dimples.

9. A computing device comprising:
one or more electronic components disposed within a housing of the computing device;
a centrifugal fan unit disposed within the housing of the computing device, the centrifugal fan unit including a hub, a plurality of blades disposed on the hub, and a motor, the motor configured to rotate the hub about an axis of the hub such that the plurality of blades cause airflow from the centrifugal fan unit to proceed outward from the hub along trajectories that are perpendicular to the axis, the one or more electronic components thermally coupled to the centrifugal fan unit with one or more thermal transfer units, the one or more thermal transfer units comprising heat transfer surfaces that are collinear with tangent lines of a circle that is formed by outside edges of the plurality of blades of the centrifugal fan unit, the heat transfer surfaces collectively at least partially surrounding the centrifugal fan unit such that the airflow moves unimpeded from the centrifugal fan unit to the one or more thermal transfer units;
a plate that is disposed on an inner portion of a surface of the computing device, the centrifugal fan unit mounted on the plate;
one or more holes on the surface of the computing device near to a position of the centrifugal fan unit to enable intake airflow to proceed towards the centrifugal fan unit from the one or more holes; and
a second housing that encloses the heat source, the centrifugal fan unit, and the thermal transfer units.

10. The computing device of claim 9, wherein the heat transfer surfaces are positioned such that the airflow from the centrifugal fan unit passes unimpeded over the heat transfer surfaces.

11. The computing device of claim 10, wherein the heat transfer surfaces form divergent channels, the divergent channels being relatively narrower at first positions that are nearer to the centrifugal fan unit than second positions that are further away from the centrifugal fan unit.

12. The computing device of claim 9, further comprising an air channel disposed within the housing of the computing device, the air channel at least partially positioned within a path of the trajectories that are perpendicular to the axis such that a combination of a portion of the air channel and the one or more thermal transfer units substantially surround the centrifugal fan unit.

13. The computing device of claim 9, further comprising at least another hole on the surface of the computing device to enable the airflow to exit the computing device, wherein a cross sectional area of the at least another hole is greater than a cross sectional area of the one or more holes.

14. A computing device comprising:
a housing of the computing device;
a processor disposed on an inner portion of a surface of the housing;
a centrifugal fan unit that is disposed on the inner portion of the surface of the housing, the centrifugal fan unit having a rotatable hub, a plurality of fan blades on the rotatable hub, and an electric motor that is operable to cause the rotatable hub to rotate about an axis such that airflow from the centrifugal fan unit blows outward in trajectories that are perpendicular to the axis;
a thermal transfer unit that thermally couples the processor to the centrifugal fan unit, the thermal transfer unit coupled to a plurality of fins that are arranged in a rounded pattern collinear with lines that are tangential to a circle that is formed by outside edges of the plurality of blades of the centrifugal fan unit and that collectively at least partially surround the centrifugal fan unit such that the airflow from the centrifugal fan unit flows through a plurality of fin channels that diverge in cross-sectional flow areas and are unimpeded in at least a portion of the trajectories that are perpendicular to the axis;

a plate that is disposed on an inner portion of a surface of the computing device, the centrifugal fan unit mounted on the plate;

one or more holes on the surface of the computing device near to a position of the centrifugal fan unit to enable intake airflow to proceed towards the centrifugal fan unit from the one or more holes; and a second housing that encloses the heat source, the centrifugal fan unit, and the thermal transfer units.

15. The computing device of claim 14, further comprising an air intake channel having an opening on another surface of the housing, the air intake channel at least partially occupying a portion of a plane that is perpendicular to the axis of the centrifugal fan unit such that a combination of a portion of the air intake channel and the plurality of fins substantially surround the centrifugal fan unit in the plane.

16. The computing device of claim 14, further comprising at least another hole on the surface of the computing device to enable the airflow to exit the computing device, wherein a cross sectional area of the at least another hole is greater than a cross sectional area of the one or more holes.

17. The computing device of claim 14, wherein the thermal transfer unit comprises a plurality of dimples.

* * * * *